United States Patent
Wu et al.

(10) Patent No.: US 7,095,091 B2
(45) Date of Patent: Aug. 22, 2006

(54) PACKAGING STACKED CHIPS WITH FINGER STRUCTURE

(75) Inventors: Kai-Chiang Wu, HsinChu (TW); Shaw-Wei Chen, HsinChu (TW)

(73) Assignee: Global Advanced Packaging Technology H.K. Limited, Kowloon (HK)

( * ) Notice: Subject to any disclaimer, the term of this patent is extended or adjusted under 35 U.S.C. 154(b) by 45 days.

(21) Appl. No.: 10/880,738

(22) Filed: Jul. 1, 2004

(65) Prior Publication Data

US 2006/0001148 A1 Jan. 5, 2006

(51) Int. Cl.
*H01L 31/06* (2006.01)

(52) U.S. Cl. .................................... 257/465

(58) Field of Classification Search ............ 257/777, 257/723, 666, 676, 778, 786, 465; 438/106, 438/126

See application file for complete search history.

(56) References Cited

U.S. PATENT DOCUMENTS 6,559,526 B1 * 5/2003 Lee et al. .................. 257/676
6,680,531 B1 * 1/2004 Hsu et al. .................. 257/723

* cited by examiner

*Primary Examiner*—Howard Weiss
*Assistant Examiner*—(Vikki) Hoa B. Trinh
(74) *Attorney, Agent, or Firm*—Rosenberg, Klein & Lee

(57) ABSTRACT

An improved finger structure applied to a packaging stack structure. The packaging stack structure is composed of several layers of chips, each chip is formed several leading wires and several finger sets are connected to the leading wire. Several finger units are formed on a finger set. The shape of these finger units is a strip structure with a bending angle, and the shape of these finger units is along an obverse direction of these leading wires to the finger unit and is changed corresponding to the obverse direction of the finger unit. The present invention can simplify the process and improve the reliability by changing the finger structure and continuously using the obverse bonding process to avoid the striking strength of the reverse bonding process.

6 Claims, 6 Drawing Sheets

PACKAGING STACKED CHIPS WITH FINGER STRUCTURE

BACKGROUND OF INVENTION

1. Field of the Invention

The invention relates to an improved finger structure, and more particularly, to an improved finger structure applied to a packaging stack structure.

2. Description of the Prior Art

For satisfying the requirement of the multi-function system with high complex, high density and thin thickness, the packaging stack structure technology is gradually developed and the multi-chip packaging stack structure is also widely utilized. The chip packaging stack technology is the technology directly stacks an IC chip on another, and the IC chips are electrically connected and packaged together. This technology can improve the capability and reduce the size.

FIG. 1 is a schematic diagram of a conventional packaging stack structure. The packaging stack structure 10 has the upper and lower chips 102, 103 with different functions. The upper chip 102 and the lower chip 103 have several leading wires 104 connecting to the finger 106, and the design of the finger 106 is shape of regular rectangle or ellipse. When the upper chip 102 and the lower chip 103 are electrically connected with the same finger 106, that also means several leading wires 104 are bonded to the same finger 106, a process issue will occur. The conventional bonding process uses a obverse bonding, that also means the upper and lower chips 102, 103 are bonded to the finger 106 along the direction shown in FIG. 2, which is a partially magnified schematic diagram of the finger 106 with the obverse bonding. The bonding direction should be designed along the upper and lower chips 102, 103 to the finger 106. When finishing the welding point on the finger 106 in the obverse bonding process, the leading wire 104 should be pressed with the steel stamp 108 and produces the fishtail structure 110 on the leading wire 104. A press distance for the steel stamp 108 is required on the finger 106.

For solving the above-mentioned problem, two ways are generally used. The first way is enlarging size of the finger 106, as shown in FIG. 3. However, since the layout space is limited and the enlarged size of the finger 106 is also limited. Another way is using the reverse bonding process, that also means the wire is bonded from the finger 106 to the chip. But the problem is that the reverse bonding process isn't a popular process in a general packaging factory, and the reverse bonding process needs forming the bump on the chip surface and then bonding from the finger 106 to the bump. The extra procedure of forming the bump will cause the process and reliability issues. For example, when bonding with hanging in the air, the chip has no support under it, and the striking strength on the chip using the reverse bonding process is larger than that using the obverse bonding process.

Hence, the present invention discloses an improved finger structure to solve the above-mentioned problem.

SUMMARY OF INVENTION

It is therefore a primary objective of the claimed invention to provide an improved finger structure to reduce size of the layout space by changing the finger structure.

It is therefore another objective of the claimed invention to provide an improved finger structure that can simplify the process and improve the reliability by changing the finger structure and continuously using the obverse bonding process to avoid the striking strength of the reverse bonding process.

For achieving the purposes, the present invention discloses an improve finger structure applied to a packaging stack structure formed at least two layers of chips. Each chip is formed a plurality of leading wires and a plurality of the finger sets are connected to these leading wires. Each finger set includes a plurality of finger units. The features are: a shape of these finger units is a strip structure with a bending angle, and the shape of these finger units is along a obverse direction of these leading wires to the finger unit and is changed corresponding to the obverse direction of the finger unit.

These and other objectives of the present invention will no doubt become obvious to those of ordinary skill in the art after reading the following detailed description of the preferred embodiment that is illustrated in the various figures and drawings.

Figure 1:
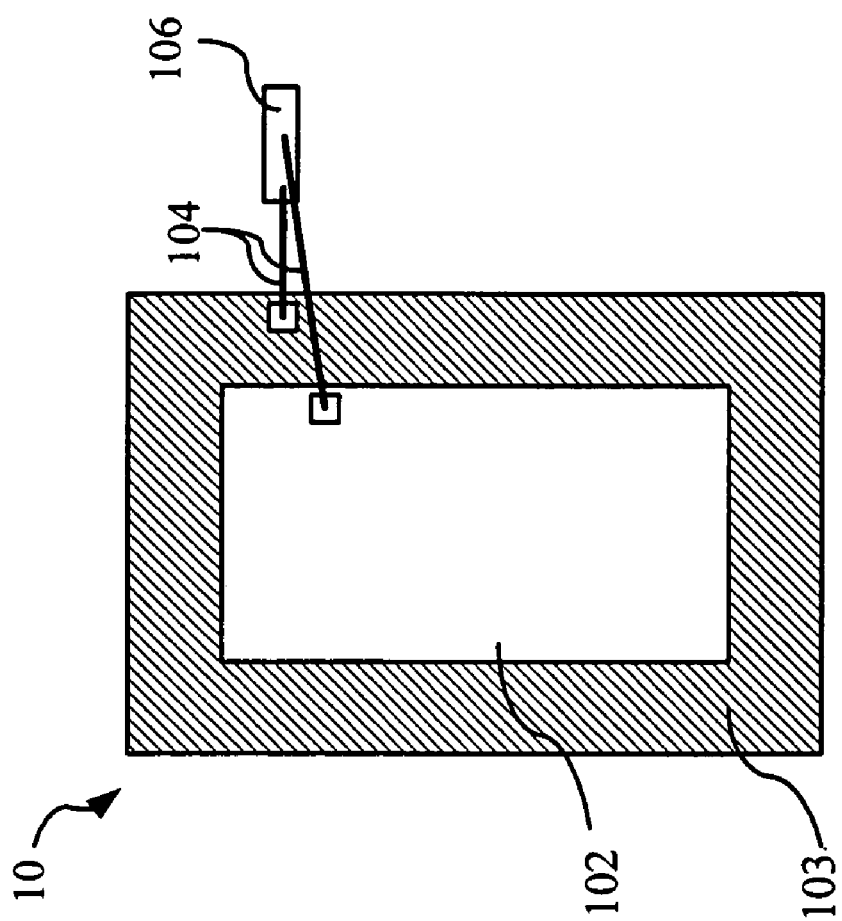
FIG. 1 is a schematic diagram of a conventional packaging stack structure.
Figure 2:
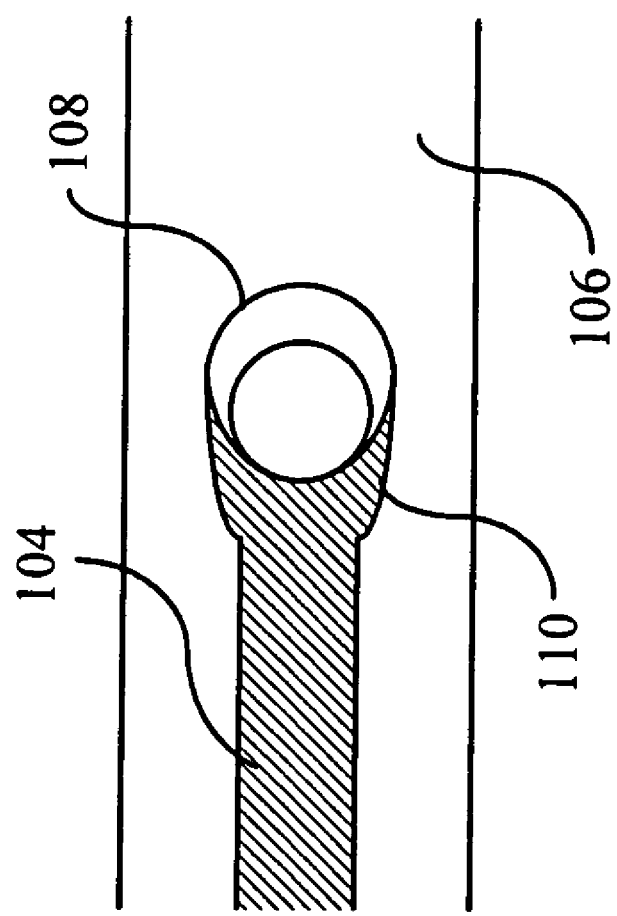
FIG. 2 is a partially magnified schematic diagram of the chip obverse bonding to the finger.
Figure 3:
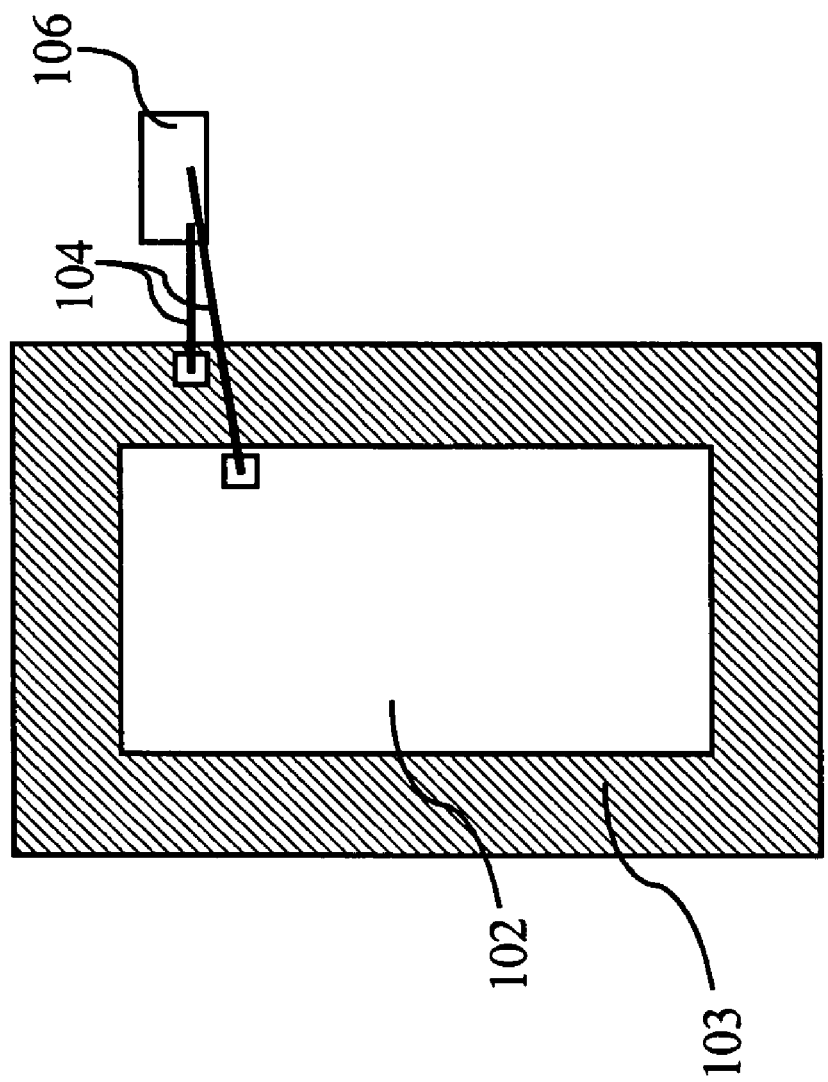
FIG. 3 is a schematic diagram of a conventional packaging stack structure enlarging the finger space.

10 packaging stack structure
102 upper chip
103 lower chip
104 leading wire
106 finger
108 steel stamp
110 fishtail structure
50 packaging stack structure
502 upper chip
504 lower chip
506 leading wire
508 finger unit
510, 512 steel stamp position

DETAILED DESCRIPTION

Figure 4:
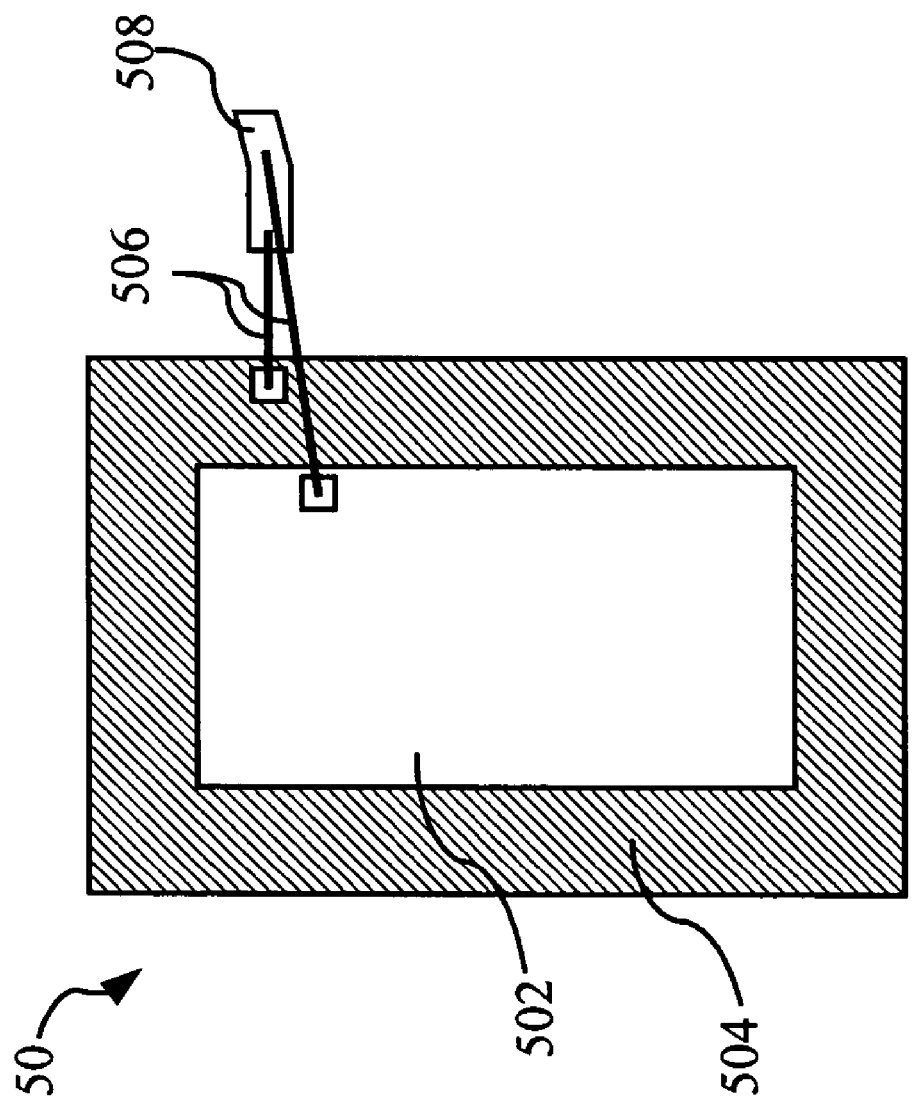
FIG. 4 is a schematic diagram of a packaging stack structure according to the present invention.
Figure 5:
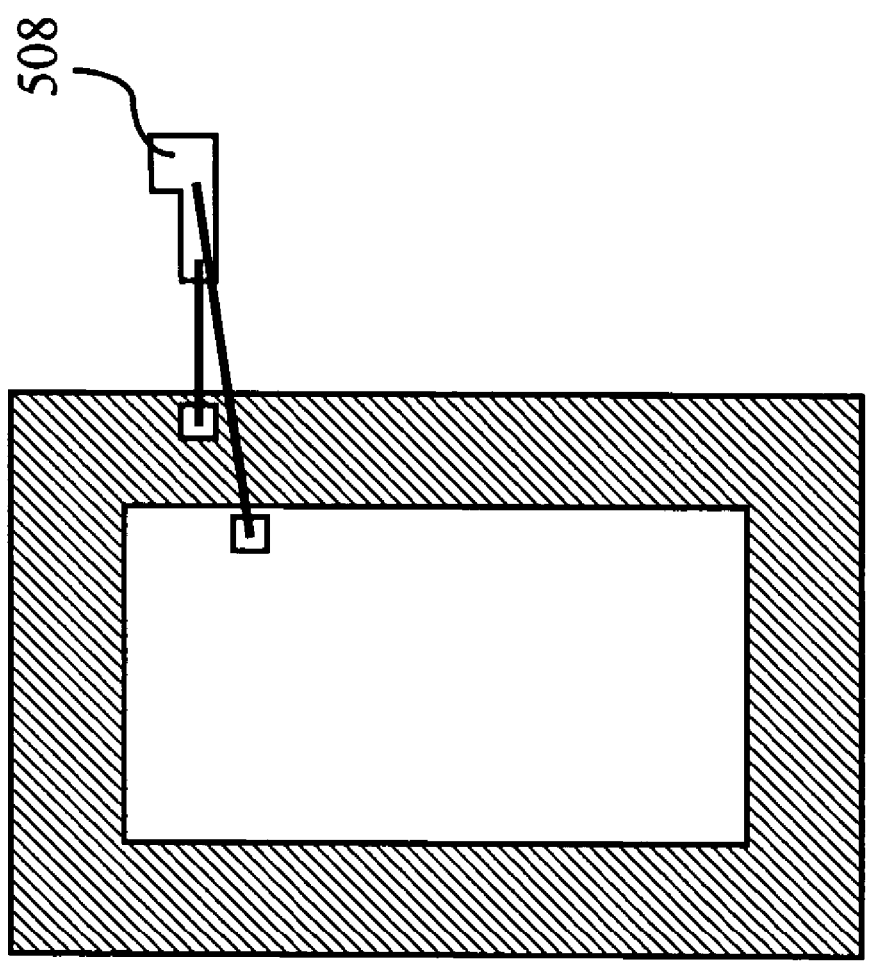
FIG. 5 is another schematic diagram of a packaging stack structure according to the present invention.

The present invention discloses an improved finger structure applied to a packaging stack structure. FIG. 4 is a schematic diagram of a packaging stack structure bonding to the finger unit according to the present invention. The packaging stack structure 50 includes several layers of chips with different functions, such as the upper chip 502 and the lower chip 504. Each chip is formed several leading wires 506 and the finger set is connected to the leading wire 506. Material of the leading wire 506 is gold, aluminum or copper, and each finger set includes several finger units 508. Several layers of chips are electrically connected to the finger set with the leading wire 506, and the shape of the finger unit 508 is along the obverse direction of the leading wire 506 to the finger unit 508 and is changed corresponding to the obverse direction of the finger unit. The shape of the finger unit 508 is a strip structure with a bending angle, and the bending angle of the finger unit 508 can be along the shape of rectangle or ellipse of the finger unit 508 and can be arc. The whole shape of the finger unit 508 can be V-shaped as shown in the figure, or can be L-shape as shown in FIG. 5. Portions of these different leading wires 506 on portions of these chips of the packaging stack structure 50 are separately connected to the same finger unit 508 of the same finger set.

Figure 6:
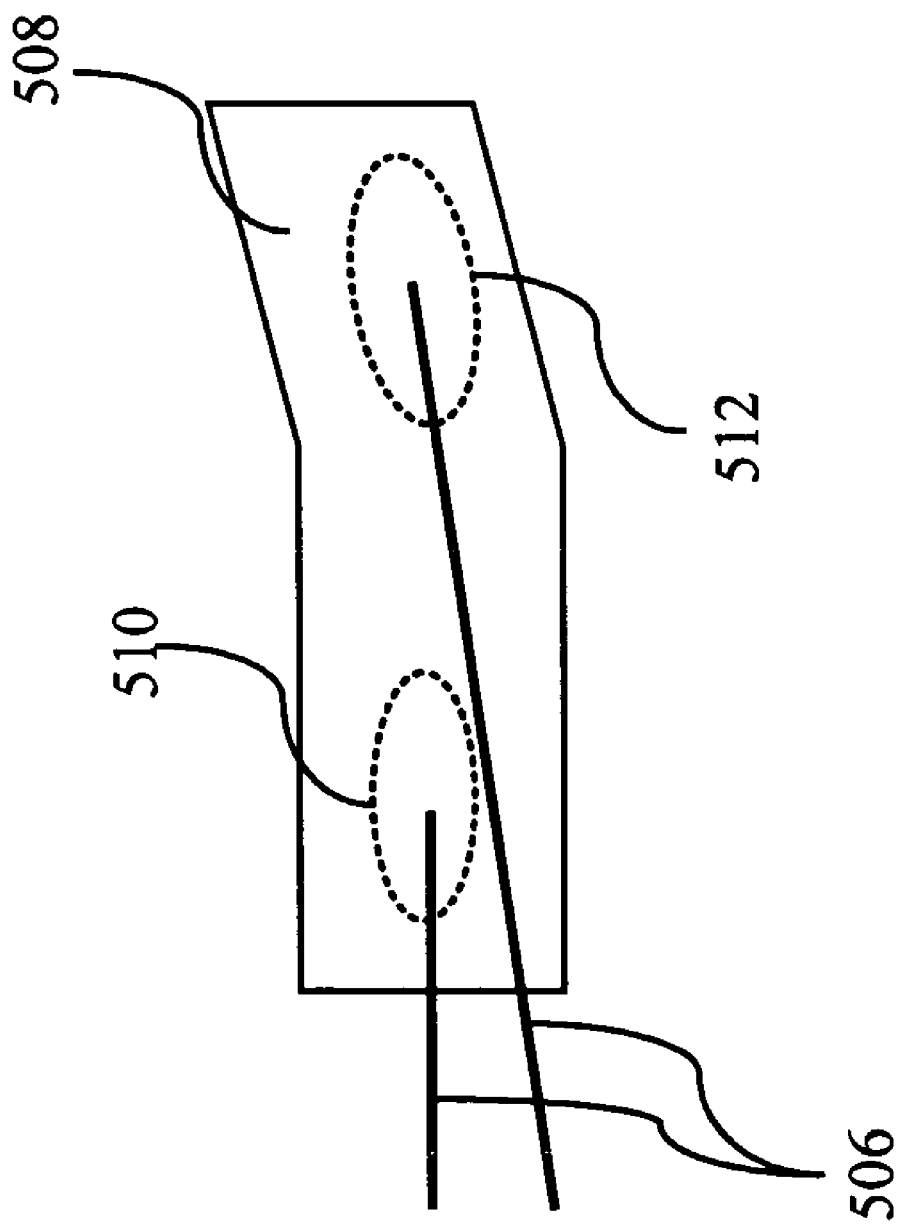
FIG. 6 is a magnified schematic diagram of the present invention applied to the finger unit.

Wherein, the shape of the finger unit 508 is designed as shown in FIG. 6, which is a magnified schematic diagram of the present invention applied to the finger unit. For continuing the obverse bonding process without using the reverse one and preventing increasing size of the finger unit 508, as shown in FIG. 6, when bonding from different chips to the same finger unit 508, a press distance of the steel stamp positions 510, 512 is retained on each leading wire 506, and a layout space is designed according to the retained steel stamp positions 510, 512, that is also to say the shape of the finger unit 508.

Wherein, the shape of the finger unit 508 can be changed along rectangle or ellipse of the regular finger unit 508, and a strip structure of the finger unit 508 with a bending angle can be designed.

When using the chips more than 3 layers, the finger unit 508 with 2 bending angles can be also designed. Size of the finger unit 508 is much less than that of the prior art, and the obverse bonding process can be also continuously used without using the reverse bonding process. Hence, the process complexity can be reduced.

In contrast to the prior art, the present invention provides an improved finger structure that can continuously use the obverse bonding process without increasing size of the finger unit. With changing structure of the finger, size of the layout space can be reduced, the process can be simplified, and the reliability can be improved. With the obverse bonding process, the striking strength of the reverse bonding process can be efficiently prevented.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A finger structure for a packaging stacked structure, wherein the packaging stacked structure includes at least a first and a second chips stacked one above another, and at least a first and a second leading wires, each coupled at one end thereof to a respective one of said first and second chips,
   the finger structure comprising; at least one finger set connected to said first and second leading wires, said at least one finger set including at least one finger unit, formed as a flat strip-like structure entirely expanding in a single plane and having a first and a second co-planar bonding areas positioned on an obverse surface of said at least one finger unit, each of said first-and second leading wires being bonded at another end thereof to said first and second bonding areas, respectively, wherein said flat strip-like structure of said at least one finger unit is formed of at least two co-planar portions angled each to the other in the same plane at a predetermined bending angle.

2. The finger structure of claim 1, wherein said at least one finger unit is V-shaped.

3. The finger structure of claim 1, wherein said at least one finger unit is L-shaped.

4. The finger structure of claim 1, wherein portions of said at least first and second leading wires on portions of said at least first and second chips are separately connected to the same finger unit of the same finger set.

5. The finger structure of claim 1, wherein material of said at least first and second leading wires is selected from a group consisting of gold, aluminum and copper.

6. The finger structure of claim 1, wherein the bending angle is arc-shaped.

* * * * *